(12) United States Patent
Xu et al.

(10) Patent No.: US 9,082,740 B2
(45) Date of Patent: Jul. 14, 2015

(54) BATTERY HEATING CIRCUITS AND METHODS USING RESONANCE COMPONENTS IN SERIES AND BRIDGE CHARGE STORAGE COMPONENTS

(75) Inventors: Wenhui Xu, Shenzhen (CN); Yaochuan Han, Shenzhen (CN); Wei Feng, Shenzhen (CN); Qinyao Yang, Shenzhen (CN); Wenjin Xia, Shenzhen (CN); Shibin Ma, Shenzhen (CN); Xianyin Li, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 910 days.

(21) Appl. No.: 13/185,744

(22) Filed: Jul. 19, 2011

(65) Prior Publication Data

US 2012/0025782 A1 Feb. 2, 2012

(30) Foreign Application Priority Data

Jul. 30, 2010 (CN) .............................. 201010245288
Aug. 30, 2010 (CN) .............................. 201010274785
Mar. 31, 2011 (CN) .............................. 201110081219

(51) Int. Cl.
*H02J 7/00* (2006.01)
*H01L 23/34* (2006.01)
(Continued)

(52) U.S. Cl.
CPC ......... *H01L 23/345* (2013.01); *H01M 10/5006* (2013.01); *H01M 10/5016* (2013.01); *H01M 10/5081* (2013.01); *H01M 10/5083* (2013.01); *H02J 7/0054* (2013.01);
(Continued)

(58) Field of Classification Search
USPC .................................. 320/128, 139, 150, 153
See application file for complete search history.

(56) References Cited

U.S. PATENT DOCUMENTS 3,654,426 A 4/1972 Brinkmann et al.
3,808,481 A 4/1974 Rippel
(Continued)

FOREIGN PATENT DOCUMENTS

CN 1630129 A 6/2005
CN 1630130 A 6/2005
(Continued)

OTHER PUBLICATIONS

Taiwan Intellectual Property Office, Office Action dated Jan. 10, 2014, in related application TW 100143128.
(Continued)

*Primary Examiner* — Drew A Dunn
*Assistant Examiner* — Zixhuan Zhou
(74) *Attorney, Agent, or Firm* — Jones Day (57) ABSTRACT

Under one aspect, a battery heating circuit includes damping and current storage components connected with the battery to form a first part of a first loop. First and second switch units are connected with the first part of the first loop. Third and fourth switch units are connected with the first part of the first loop to form a second loop. A charge storage component is connected across the first and second loops. The first and third switch units and charge storage component form branches transferring energy between the battery and charge storage component, and the fourth and second switch units and charge storage component form branches transferring energy between the battery and charge storage component. The switching control module switches on and off the first through fourth switch units to control energy flow between the battery and charge storage component.

8 Claims, 5 Drawing Sheets

(51) Int. Cl.
  *H01M 10/615* (2014.01)
  *H01M 10/625* (2014.01)
  *H01M 10/657* (2014.01)
  *H01M 10/6571* (2014.01)
  *H02M 3/158* (2006.01)

(52) U.S. Cl.
  CPC ...... *H01L 2924/0002* (2013.01); *H02J 7/0014* (2013.01); *H02J 7/0075* (2013.01); *H02J 7/0091* (2013.01); *H02J 7/0093* (2013.01); *H02M 3/158* (2013.01); *Y02E 60/12* (2013.01); *Y02T 10/7055* (2013.01)

(56) References Cited

U.S. PATENT DOCUMENTS

| | | |
|---|---|---|
| 4,171,508 A | 10/1979 | Sinclair |
| 4,184,197 A | 1/1980 | Cuk et al. |
| 4,222,000 A | 9/1980 | Silvertown et al. |
| 5,362,942 A | 11/1994 | Vanderslice, Jr. et al. |
| 5,396,165 A * | 3/1995 | Hwang et al. ............... 323/210 |
| 5,461,556 A | 10/1995 | Horie et al. |
| 5,523,671 A | 6/1996 | Stewart |
| 5,561,597 A | 10/1996 | Limpaecher |
| 5,768,114 A | 6/1998 | Gruning et al. |
| 5,789,905 A | 8/1998 | Yamasaki |
| 5,808,469 A | 9/1998 | Kopera |
| 5,905,371 A | 5/1999 | Limpaecher |
| 5,943,224 A | 8/1999 | Mao |
| 5,948,298 A | 9/1999 | Ijaz |
| 5,990,661 A | 11/1999 | Ashtiani et al. |
| 6,002,240 A | 12/1999 | McMahan et al. |
| 6,072,301 A | 6/2000 | Ashtiani et al. |
| 6,078,163 A | 6/2000 | Horie et al. |
| 6,142,130 A | 11/2000 | Ward |
| 6,211,652 B1 | 4/2001 | Glasgow |
| 6,259,229 B1 | 7/2001 | Ashtiani et al. |
| 6,340,879 B1 | 1/2002 | Bläcker |
| 6,771,518 B2 | 8/2004 | Orr et al. |
| 6,882,061 B1 | 4/2005 | Ashtiani et al. |
| 7,292,010 B2 | 11/2007 | Hsu et al. |
| 7,382,102 B2 | 6/2008 | Ashtiani |
| 7,402,982 B2 | 7/2008 | Ito et al. |
| 7,876,583 B2 | 1/2011 | Polivka et al. |
| 8,004,866 B2 | 8/2011 | Bucella et al. |
| 8,197,502 B2 | 6/2012 | Smith et al. |
| 8,493,036 B2 * | 7/2013 | Ferrario ............... 320/166 |
| 2005/0077879 A1 | 4/2005 | Near |
| 2005/0156578 A1 | 7/2005 | Karmenoff |
| 2005/0168195 A1 | 8/2005 | MacDougall |
| 2005/0264237 A1 | 12/2005 | Ishizuka |
| 2007/0024243 A1 | 2/2007 | Liu et al. |
| 2007/0091023 A1 | 4/2007 | Kosaka et al. |
| 2007/0121258 A1 | 5/2007 | Hachiya |
| 2009/0014436 A1 | 1/2009 | Toya et al. |
| 2009/0243547 A1 | 10/2009 | Andelfinger |
| 2011/0095711 A1 | 4/2011 | Hsieh et al. |
| 2011/0144861 A1 | 6/2011 | Lakirovich et al. |
| 2011/0273136 A1 | 11/2011 | Yoshimoto |
| 2012/0024838 A1 | 2/2012 | Xu et al. |
| 2012/0025754 A1 | 2/2012 | Xu et al. |
| 2012/0025755 A1 | 2/2012 | Xu et al. |
| 2012/0025756 A1 | 2/2012 | Xu et al. |
| 2012/0025772 A1 | 2/2012 | Xu et al. |
| 2012/0025774 A1 | 2/2012 | Xu et al. |
| 2012/0025775 A1 | 2/2012 | Xu et al. |
| 2012/0025776 A1 | 2/2012 | Xu et al. |
| 2012/0025777 A1 | 2/2012 | Xu et al. |
| 2012/0025778 A1 | 2/2012 | Xu et al. |
| 2012/0025779 A1 | 2/2012 | Xu et al. |
| 2012/0025780 A1 | 2/2012 | Xu et al. |
| 2012/0025781 A1 | 2/2012 | Xu et al. |
| 2012/0025783 A1 | 2/2012 | Xu et al. |
| 2012/0031890 A1 | 2/2012 | Han et al. |
| 2012/0032642 A1 | 2/2012 | Xu et al. |
| 2012/0126753 A1 | 5/2012 | Carkner |
| 2012/0161711 A1 | 6/2012 | Xu et al. |
| 2012/0279951 A1 | 11/2012 | Xu et al. |
| 2012/0280658 A1 | 11/2012 | Xu et al. |
| 2012/0280659 A1 | 11/2012 | Xu et al. |
| 2012/0299551 A1 | 11/2012 | Xu et al. |
| 2012/0306432 A1 | 12/2012 | Xu et al. |
| 2013/0127398 A1 | 5/2013 | Xu et al. |
| 2013/0134146 A1 | 5/2013 | Han et al. |
| 2013/0134945 A1 | 5/2013 | Xu et al. |
| 2013/0141032 A1 | 6/2013 | Xu et al. |

FOREIGN PATENT DOCUMENTS

| | | |
|---|---|---|
| CN | 1809942 A | 7/2006 |
| CN | 1836356 A | 9/2006 |
| CN | 1291518 C | 12/2006 |
| CN | 101552479 A | 10/2009 |
| CN | 201397868 Y | 2/2010 |
| CN | 101685971 A | 3/2010 |
| CN | 201435426 Y | 3/2010 |
| CN | 201667552 U | 12/2010 |
| CN | 102055042 A | 5/2011 |
| CN | 102074756 A | 5/2011 |
| CN | 201936966 U | 8/2011 |
| CN | 201936967 U | 8/2011 |
| CN | 201936969 U | 8/2011 |
| CN | 201966300 U | 9/2011 |
| CN | 202009059 U | 10/2011 |
| CN | 202042567 IJ | 11/2011 |
| CN | 202076380 U | 12/2011 |
| CN | 202103139 U | 1/2012 |
| CN | 202121024 U | 1/2012 |
| CN | 102074755 B | 5/2012 |
| CN | 102074758 B | 6/2012 |
| CN | 102074759 B | 6/2012 |
| CN | 102074753 B | 7/2012 |
| CN | 102074756 B | 7/2012 |
| CN | 102074760 B | 7/2012 |
| CN | 102074762 B | 7/2012 |
| CN | 102074761 B | 9/2012 |
| CN | 102088117 B | 9/2012 |
| CN | 102082306 B | 11/2012 |
| CN | 102088116 B | 11/2012 |
| EP | 0 418 919 A2 | 3/1991 |
| EP | 1 930 922 A2 | 6/2008 |
| JP | 4-12472 A | 1/1992 |
| JP | 5022876 A | 1/1993 |
| JP | 2007-166779 A | 6/2007 |
| JP | 4016045 B2 | 12/2007 |
| SU | 813544 B | 3/1981 |
| TW | 220014 B | 2/1994 |
| TW | 269727 B | 2/1996 |
| TW | 344721 B | 11/1998 |
| TW | 200518370 A | 6/2005 |
| TW | 200527793 A | 8/2005 |
| TW | M275625 U | 9/2005 |
| WO | WO 2010/145439 A1 | 12/2010 |

OTHER PUBLICATIONS

Taiwan Intellectual Property Office, Office Action dated Jan. 10, 2014, in related application TW 100143130.
Taiwan Intellectual Property Office, Office Action dated Jan. 10, 2014, in related application TW 100143133.
Taiwan Intellectual Property Office, Office Action dated Jan. 7, 2014, in related application TW 100140587.
Taiwan Intellectual Property Office, Office Action dated Jan. 6, 2014, in related application TW 100140588.
Taiwan Intellectual Property Office, Office Action dated Feb. 17, 2014, in related application TW 100143160.
Taiwan Intellectual Property Office, Office Action dated Jan. 6, 2014, in related application TW 100140590.
Taiwan Intellectual Property Office, Office Action dated Jan. 17, 2014, in related application TW 100141797.
Taiwan Intellectual Property Office, Office Action dated Jan. 17, 2014, in related application TW 100141802.

(56) References Cited

OTHER PUBLICATIONS

United States Patent and Trademark Office, Notice of Allowance mailed Dec. 5, 2013, in related patent application U.S. Appl. No. 13/166,281.
United States Patent and Trademark Office, Notice of Allowance mailed Nov. 8, 2013, in related patent application U.S. Appl. No. 13/166,301.
United States Patent and Trademark Office, Notice of Allowance mailed Jan. 6, 2014, in related patent application U.S. Appl. No. 13/189,096.
United States Patent and Trademark Office, Notice of Allowance mailed Jan. 6, 2014, in related patent application U.S. Appl. No. 13/187,874.
United States Patent and Trademark Office, Office Action mailed Nov. 20, 2013, in related patent application U.S. Appl. No. 13/168,004.
United States Patent and Trademark Office, Office Action mailed Nov. 22, 2013, in related patent application U.S. Appl. No. 13/168,014.
United States Patent and Trademark Office, Final Office Action mailed Feb. 25, 2014, in related patent application U.S. Appl. No. 13/170,021.
United States Patent and Trademark Office, Office Action mailed Jan. 6, 2014, in related patent application U.S. Appl. No. 13/187,266.
United States Patent and Trademark Office, Office Action mailed Jan. 3, 2014, in related patent application U.S. Appl. No. 13/184,906.
United States Patent and Trademark Office, Office Action mailed Jan. 2, 2014, in related patent application U.S. Appl. No. 13/189,114.
United States Patent and Trademark Office, Office Action mailed Dec. 3, 2013, in related patent application U.S. Appl. No. 13/187,279.
United States Patent and Trademark Office, Office Action mailed Dec. 4, 2013, in related patent application U.S. Appl. No. 13/187,890.
United States Patent and Trademark Office, Office Action mailed Jan. 6, 2014, in related patent application U.S. Appl. No. 13/541,487.
United States Patent and Trademark Office, Office Action mailed Dec. 4, 2013, in related patent application U.S. Appl. No. 13/748,525.
United States Patent and Trademark Office, Office Action mailed Jan. 15, 2014, in related patent application U.S. Appl. No. 13/749,480.
China Patent Office, Office Action dated Sep. 21, 2011, in related application CN 201010603658.3.
China Patent Office, Office Action dated Jul. 27, 2011, in related application CN 201010603717.7.
China Patent Office, Office Action dated Jul. 27, 2011, in related application CN 201010604714.5.
China Patent Office, Office Action dated Sep. 5, 2011, in related application CN 201010606082.6.
China Patent Office, Office Action dated Sep. 21, 2011, in related application CN 201010605772.X.
China Patent Office, Office Action dated Feb. 2, 2012, in related application CN 201010604777.0.
China Patent Office, Office Action dated Sep. 2, 2011, in related application CN 201010604777.0.
China Patent Office, Office Action dated Jan. 9, 2012, in related application CN 201010604729.1.
China Patent Office, Office Action dated Jul. 18, 2011, in related application CN 201010604729.1.
China Patent Office, Office Action dated Dec. 28, 2011, in related application CN 201010603719.6.
China Patent Office, Office Action dated Jul. 28, 2011, in related application CN 201010603719.6.
China Patent Office, Office Action dated Jan. 5, 2012, in related application CN 201010603471.3.
China Patent Office, Office Action dated Jul. 15, 2011, in related application CN 201010603471.3.
China Patent Office, Office Action dated Jul. 27, 2011, in related application CN 201010603414.5.
China Patent Office, Office Action dated Nov. 16, 2011, in related application CN 201010603414.5.
China Patent Office, Office Action dated Aug. 1, 2011, in related application CN 201010603669.1.
China Patent Office, Office Action dated Sep. 15, 2011, in related application CN 201010604677.8.
China Patent Office, Office Action dated Feb. 2, 2012, in related application CN 201010604744.6.
China Patent Office, Office Action dated Sep. 20, 2011, in related application CN 201010604744.6.
China Patent Office, Office Action dated Oct. 25, 2011, in related application CN 201110080853.7.
China Patent Office, Office Action dated Nov. 1, 2011, in related application CN 201110081219.5.
China Patent Office, Office Action dated Jan. 21, 2012, in related application CN 201110081276.3.
China Patent Office, Office Action dated Jun. 5, 2012, in related application CN 201110081276.3.
China Patent Office, Office Action dated May 16, 2012, in related application CN 201110137264.8.
China Patent Office, Office Action dated Jan. 21, 2012, in related application CN 201110132362.2.
China Patent Office, Office Action dated Jan. 21, 2012, in related application CN 201110134005.X.
China Patent Office, Office Action dated May 2, 2012, in related application CN 201110134005.X.
European Patent Office, Extended European Search Report dated Sep. 13, 2011, in related application EP 11166955.2.
European Patent Office, Extended European Search Report dated Nov. 30, 2011, in related application EP 11166938.8.
European Patent Office, Extended European Search Report dated Dec. 15, 2011, in related application EP 11166941.2.
European Patent Office, Extended European Search Report dated Sep. 16, 2011, in related application EP 11166949.5.
European Patent Office, Extended European Search Report dated Oct. 6, 2011, in related application EP 11166925.5.
European Patent Office, European Search Report dated Sep. 29, 2011, in related application EP 11166958.6.
European Patent Office, Extended European Search Report dated Jan. 25, 2012, in related application EP 11166952.9.
European Patent Office, European Search Report dated Sep. 21, 2011, in related application EP 11166969.3.
European Patent Office, European Search Report dated Sep. 1, 2011, in related application EP 11166903.2.
European Patent Office, Extended European Search Report dated Nov. 8, 2011, in related application EP 11166872.9.
European Patent Office, Extended European Search Report dated Nov. 25, 2011, in related application EP 11166882.8.
European Patent Office, Extended European Search Report dated Nov. 25, 2011, in related application EP 11166897.6.
European Patent Office, Extended European Search Report dated Sep. 6, 2011, in related application EP 11166900.8.
European Patent Office, Extended European Search Report dated Sep. 23, 2011, in related application EP 11166914.9.
European Patent Office, Extended European Search Report dated Nov. 8, 2011, in related application EP 11166920.6.
European Patent Office, Extended European Search Report dated Sep. 27, 2011, in related application EP 11167066.7.
European Patent Office, Extended European Search Report dated Sep. 8, 2011, in related application EP 11166902.4.
European Patent Office, Extended European Search Report dated Oct. 6, 2011, in related application EP 11167128.5.
Patent Cooperation Treaty, International Search Report and Written Opinion, dated Sep. 1, 2011, in related application PCT/CN2011/074449.
Patent Cooperation Treaty, International Search Report and Written Opinion, dated Aug. 18, 2011, in related application PCT/CN2011/074453.
Patent Cooperation Treaty, International Search Report and Written Opinion, dated Aug. 11, 2011, in related application PCT/CN2011/074463.
Patent Cooperation Treaty, International Search Report and Written Opinion, dated Aug. 25, 2011, in related application PCT/CN2011/074458.
Patent Cooperation Treaty, International Search Report and Written Opinion, dated Aug. 11, 2011, in related application PCT/CN2011/074462.

(56) References Cited

OTHER PUBLICATIONS

Patent Cooperation Treaty, International Search Report and Written Opinion, dated Aug. 11, 2011, in related application PCT/CN2011/074457.
Patent Cooperation Treaty, International Search Report and Written Opinion, dated Aug. 25, 2011, in related application PCT/CN2011/074459.
Patent Cooperation Treaty, International Search Report and Written Opinion, dated Aug. 18, 2011, in related application PCT/CN2011/074456.
Patent Cooperation Treaty, International Search Report and Written Opinion, dated Aug. 18, 2011, in related application PCT/CN2011/074460.
Patent Cooperation Treaty, International Search Report and Written Opinion, dated Aug. 11, 2011, in related application PCT/CN2011/074433.
Patent Cooperation Treaty, International Search Report and Written Opinion, dated Aug. 18, 2011, in related application PCT/CN2011/074436.
Patent Cooperation Treaty, International Search Report and Written Opinion, dated Aug. 25, 2011, in related application PCT/CN2011/074438.
Patent Cooperation Treaty, International Search Report and Written Opinion, dated Aug. 11, 2011, in related application PCT/CN2011/074440.
Patent Cooperation Treaty, International Search Report and Written Opinion, dated Aug. 25, 2011, in related application PCT/CN2011/074455.
Patent Cooperation Treaty, International Search Report and Written Opinion, dated Aug. 11, 2011, in related application PCT/CN2011/074461.
Patent Cooperation Treaty, International Search Report and Written Opinion, dated Sep. 1, 2011, in related application PCT/CN2011/074531.
Patent Cooperation Treaty, International Search Report and Written Opinion, dated Aug. 18, 2011, in related application PCT/CN2011/074442.
Patent Cooperation Treaty, International Search Report and Written Opinion, dated Jul. 21, 2011, in related application PCT/CN2011/074536.
United States Patent and Trademark Office, Office Action mailed Jul. 16, 2013, in related patent application U.S. Appl. No. 13/166,281.
United States Patent and Trademark Office, Office Action mailed May 31, 2013, in related patent application U.S. Appl. No. 13/168,004.
United States Patent and Trademark Office, Office Action mailed May 22, 2013, in related patent application U.S. Appl. No. 13/168,014.
United States Patent and Trademark Office, Office Action mailed Jul. 5, 2013, in related patent application U.S. Appl. No. 13/170,021.
United States Patent and Trademark Office, Office Action mailed Jul. 30, 2013, in related patent application U.S. Appl. No. 13/166,301.
United States Patent and Trademark Office, Office Action mailed Sep. 5, 2013, in related patent application U.S. Appl. No. 13/189,096.
United States Patent and Trademark Office, Office Action mailed Aug. 29, 2013, in related patent application U.S. Appl. No. 13/187,874.
United States Patent and Trademark Office, Office Action mailed Aug. 29, 2013, in related patent application U.S. Appl. No. 13/189,114.
United States Patent and Trademark Office, Office Action mailed Sep. 30, 2013, in related patent application U.S. Appl. No. 13/170,044.
United States Patent and Trademark Office, Office Action mailed Jun. 19, 2013, in related patent application U.S. Appl. No. 13/187,890.
United States Patent and Trademark Office, Office Action mailed Sep. 26, 2014, in related patent application U.S. Appl. No. 13/544,881.
United States Patent and Trademark Office, Office Action mailed Sep. 3, 2014, in related patent application U.S. Appl. No. 13/486,883.
United States Patent and Trademark Office, Office Action mailed Sep. 11, 2014, in related patent application U.S. Appl. No. 13/465,906.
United States Patent and Trademark Office, Office Action mailed Sep. 11, 2014, in related patent application U.S. Appl. No. 13/545,885.
United States Patent and Trademark Office, Notice of Allowance mailed Oct. 6, 2014, in related patent application U.S. Appl. No. 13/168,014.
United States Patent and Trademark Office, Notice of Allowance mailed Oct. 6, 2014, in related patent application U.S. Appl. No. 13/184,906.
United States Patent and Trademark Office, Notice of Allowance mailed Oct. 6, 2014, in related patent application U.S. Appl. No. 13/187,279.
United States Patent and Trademark Office, Notice of Allowance mailed Oct. 3, 2014, in related patent application U.S. Appl. No. 13/187,890.
United States Patent and Trademark Office, Notice of Allowance mailed Oct. 7, 2014, in related patent application U.S. Appl. No. 13/541,487.
United States Patent and Trademark Office, Notice of Allowance mailed Oct. 6, 2014, in related patent application U.S. Appl. No. 13/748,525.
United States Patent and Trademark Office, Notice of Allowance mailed Oct. 6, 2014, in related patent application U.S. Appl. No. 13/749,480.
United States Patent and Trademark Office, Office Action mailed Nov. 13, 2014, in related patent application U.S. Appl. No. 13/168,004.
United States Patent and Trademark Office, Office Action mailed Nov. 17, 2014, in related patent application U.S. Appl. No. 13/187,266.
United States Patent and Trademark Office, Office Action mailed Jun. 10, 2014, in related patent application U.S. Appl. No. 13/168,004.
United States Patent and Trademark Office, Office Action mailed Jun. 18, 2014, in related patent application U.S. Appl. No. 13/168,014.
United States Patent and Trademark Office, Office Action mailed Jun. 16, 2014, in related patent application U.S. Appl. No. 13/184,879.
United States Patent and Trademark Office, Office Action mailed Jun. 20, 2014, in related patent application U.S. Appl. No. 13/184,894.
United States Patent and Trademark Office, Office Action mailed Jun. 25, 2014, in related patent application U.S. Appl. No. 13/187,266.
United States Patent and Trademark Office, Office Action mailed Jun. 24, 2014, in related patent application U.S. Appl. No. 13/184,906.
United States Patent and Trademark Office, Office Action mailed Jun. 16, 2014, in related patent application U.S. Appl. No. 13/184,915.
United States Patent and Trademark Office, Office Action mailed Jun. 24, 2014, in related patent application U.S. Appl. No. 13/187,279.
United States Patent and Trademark Office, Office Action mailed Jun. 13, 2014, in related patent application U.S. Appl. No. 13/185,756.
United States Patent and Trademark Office, Office Action mailed Jul. 7, 2014, in related patent application U.S. Appl. No. 13/187,890.
United States Patent and Trademark Office, Office Action mailed Jun. 25, 2014, in related patent application U.S. Appl. No. 13/541,487.
United States Patent and Trademark Office, Office Action mailed Jun. 26, 2014, in related patent application U.S. Appl. No. 13/748,525.
United States Patent and Trademark Office, Office Action mailed Jun. 24, 2014, in related patent application U.S. Appl. No. 13/749,480.
United States Patent and Trademark Office, Notice of Allowance mailed Apr. 25, 2014, in related patent application U.S. Appl. No. 13/166,281.
United States Patent and Trademark Office, Notice of Allowance mailed Jun. 24, 2014, in related patent application U.S. Appl. No. 13/170,021.
United States Patent and Trademark Office, Notice of Allowance mailed May 2, 2014, in related patent application U.S. Appl. No. 13/166,301.
United States Patent and Trademark Office, Notice of Allowance mailed Jun. 18, 2014, in related patent application U.S. Appl. No. 13/189,096.

(56) References Cited

OTHER PUBLICATIONS

United States Patent and Trademark Office, Notice of Allowance mailed May 8, 2014, in related patent application U.S. Appl. No. 13/187,874.

United States Patent and Trademark Office, Notice of Allowance mailed Apr. 28, 2014, in related patent application U.S. Appl. No. 13/189,114.

United States Patent and Trademark Office, Notice of Allowance mailed May 22, 2014, in related patent application U.S. Appl. No. 13/170,044.

United States Patent and Trademark Office, Office Action mailed Dec. 11, 2014, in related patent application U.S. Appl. No. 13/184,879.

United States Patent and Trademark Office, Office Action mailed Dec. 24, 2014, in related patent application U.S. Appl. No. 13/184,894.

United States Patent and Trademark Office, Office Action mailed Jan. 13, 2015, in related patent application U.S. Appl. No. 13/184,915.

United States Patent and Trademark Office, Office Action mailed Dec. 31, 2014, in related patent application U.S. Appl. No. 13/185,756.

United States Patent and Trademark Office, Office Action mailed Feb. 13, 2015, in related patent application U.S. Appl. No. 13/465,906.

United States Patent and Trademark Office, Corrected Notice of Allowability mailed Feb. 11, 2015, in related patent application U.S. Appl. No. 13/187,279.

United States Patent and Trademark Office, Notice of Allowance mailed Feb. 18, 2015, in related patent application U.S. Appl. No. 13/168,004.

United States Patent and Trademark Office, Notice of Allowance mailed Mar. 3, 2015, in related patent application U.S. Appl. No. 13/544,881.

United States Patent and Trademark Office, Corrected Notice of Allowability mailed Feb. 23, 2015, in related patent application U.S. Appl. No. 13/748,525.

United States Patent and Trademark Office, Office Action mailed Mar. 25, 2015, in related U.S. Appl. No. 13/187,266.

United States Patent and Trademark Office, Office Action mailed Apr. 1, 2015, in related U.S. Appl. No. 13/747,387.

United States Patent and Trademark Office, Office Action mailed Apr. 13, 2015, in related U.S. Appl. No. 13/545,885.

United States Patent and Trademark Office, Corrected Notice of Allowability mailed Apr. 3, 2015, in related U.S. Appl. No. 13/168,004.

United States Patent and Trademark Office, Notice of Allowance mailed Mar. 18, 2015, in related U.S. Appl. No. 13/184,879.

United States Patent and Trademark Office, Notice of Allowance mailed Mar. 27, 2015, in related U.S. Appl. No. 13/184,894.

United States Patent and Trademark Office, Notice of Allowance mailed Mar. 23, 2015, in related U.S. Appl. No. 13/185,744.

United States Patent and Trademark Office, Notice of Allowance mailed Mar. 30, 2015, in related U.S. Appl. No. 13/184,915.

United States Patent and Trademark Office, Notice of Allowance mailed Apr. 29, 2015, in related U.S. Appl. No. 13/185,756.

United States Patent and Trademark Office, Supplemental Notice of Allowability mailed Mar. 17, 2015, in related U.S. Appl. No. 13/544,881.

United States Patent and Trademark Office, Notice of Allowance mailed Mar. 27, 2015, in related U.S. Appl. No. 13/747,378.

United States Patent and Trademark Office, Notice of Allowance mailed Mar. 18, 2015, in related U.S. Appl. No. 13/486,883.

United States Patent and Trademark Office, Corrected Notice of Allowability mailed May 13, 2015, in related U.S. Appl. No. 13/168,004.

United States Patent and Trademark Office, Corrected Notice of Allowability mailed May 20, 2015, in related U.S. Appl. No. 13/184,894.

United States Patent and Trademark Office, Corrected Notice of Allowability mailed May 21, 2015, in related U.S. Appl. No. 13/184,915.

United States Patent and Trademark Office, Supplemental Notice of Allowability mailed May 20, 2015, in related U.S. Appl. No. 13/544,881.

United States Patent and Trademark Office. Supplemental Notice of Allowability mailed May 13, 2015, in related U.S. Appl. No. 13/747,378.

United States Patent and Trademark Office, Notice of Allowance mailed May 20, 2015, in related U.S. Appl. No. 13/465,906.

* cited by examiner

BATTERY HEATING CIRCUITS AND METHODS USING RESONANCE COMPONENTS IN SERIES AND BRIDGE CHARGE STORAGE COMPONENTS

1. CROSS-REFERENCE TO RELATED APPLICATIONS

This application claims priority to Chinese Patent Application No. 201010245288.0, filed Jul. 30, 2010, Chinese Patent Application No. 201010274785.3, filed Aug. 30, 2010, and Chinese Patent Application No. 201110081219.5, filed Mar. 31, 2011, all these three applications being incorporated by reference herein for all purposes.

Additionally, this application is related to International Application Publication No. WO2010/145439A1 and Chinese Application Publication No. CN102055042A, both these two applications being incorporated by reference herein for all purposes.

2. BACKGROUND OF THE INVENTION

The present invention pertains to electric and electronic field, in particular related to a battery heating circuit.

Considering cars need to run under complex road conditions and environmental conditions or some electronic devices are used under harsh environmental conditions, the battery, which serves as the power supply unit for electric-motor cars or electronic devices, need to be adaptive to these complex conditions. In addition, besides these conditions, the service life and charge/discharge cycle performance of the battery need to be taken into consideration; especially, when electric-motor cars or electronic devices are used in low temperature environments, the battery needs to have outstanding low-temperature charge/discharge performance and higher input/output power performance.

Usually, under low temperature conditions, the resistance of the battery will increase, and so will the polarization; therefore, the capacity of the battery will be reduced.

To keep the capacity of the battery and improve the charge/discharge performance of the battery under low temperature conditions, some embodiments of the present invention provide a battery heating circuit.

3. BRIEF SUMMARY OF THE INVENTION

The objective of certain embodiments of the present invention is to provide a battery heating circuit, in order to solve the problem of decreased capacity of the battery caused by increased resistance and polarization of the battery under low temperature conditions.

A battery heating circuit is provided, comprising a first switch unit (11), a second switch unit (12), a third switch unit (13), a fourth switch unit (14), a switching control module (100), a damping component R1, a current storage component L1, and a charge storage component C1; the damping component R1 and current storage component L1 are configured to connect with the battery in series to form a branch; the first switch unit (11) and second switch unit (12) are connected in series with each other and then connected in parallel with the branch; the third switch unit (13) and fourth switch unit (14) are connected in series with each other and then connected in parallel with the branch; the charge storage component C1 is connected in series between the junction point of the first switch unit (11) and second switch unit (11) and the junction point of the third switch unit (13) and fourth switch unit (14), so that the first switch unit (11), charge storage component C1, and third switch unit (13) form a first branch configured to transfer energy from the battery to the charge storage component C1 and a second branch configured to transfer energy from the charge storage component C1 to the battery, and the fourth switch unit (14), charge storage component C1, and second switch unit (12) form a third branch configured to transfer energy from the battery to the charge storage component C1 and a fourth branch configured to transfer energy from the charge storage component C1 to the battery; the switching control module (100) is connected with the first switch unit (11), second switch unit (12), third switch unit (13), and fourth switch unit (14) respectively, and is configured to control ON/OFF of the first switch unit (11), second switch unit (12), third switch unit (13), and fourth switch unit (14), so as to control the energy flow between the battery and the charge storage component C1.

The heating circuit provided in certain embodiments of the present invention can improve the charge/discharge performance of the battery; in addition, safety problem caused by short circuit can be avoided when the battery is heated due to the existence of the charge storage component connected in series, and therefore the battery can be protected effectively.

Other characteristics and advantages of the present invention will be further described in detail in the following section for embodiments.

4. BRIEF DESCRIPTION OF THE DRAWINGS

The accompanying drawings, as a part of this description, are provided here to facilitate further understanding of the present invention, and are used in conjunction with the following embodiments to explain the present invention, but shall not be comprehended as constituting any limitation on the present invention. In the figures.

5. DETAILED DESCRIPTION OF THE INVENTION

Certain embodiments of the present invention are described in detail below, with reference to the accompanying drawings. It should be appreciated that the embodiments described here are only provided to describe and explain the present invention, but shall not be deemed as constituting any limitation on the present invention.

It is noted that, unless otherwise specified, when mentioned hereafter in this description, the term "switching control module" may refer to any controller that can output control commands (e.g., pulse waveforms) under preset conditions or at preset times and thereby control the switch unit connected to it to switch on or switch off accordingly, according to some embodiments. For example, the switching control module can be a PLC. Unless otherwise specified, when mentioned hereafter in this description, the term "switch" may refer to a switch that enables ON/OFF control by using electrical signals or enables ON/OFF control on the basis of the characteristics of the component according to certain embodiments. For example, the switch can be either a one-way switch (e.g., a switch composed of a two-way switch and a diode connected in series, which can be conductive in one direction) or a two-way switch (e.g., a Metal Oxide Semiconductor Field Effect Transistor (MOSFET) or an IGBT with an anti-parallel freewheeling diode). Unless otherwise specified, when mentioned hereafter in this description, the term "two-way switch" may refer to a switch that can be conductive in two directions, which can enable ON/OFF control by using electrical signals or enable ON/OFF control on the basis of the characteristics of the component according to some embodiments. For example, the two-way switch can be a MOSFET or an IGBT with an anti-parallel freewheeling diode. Unless otherwise specified, when mentioned hereafter in this description, the term "one-way semiconductor component" may refer to a semiconductor component that can be conductive in one direction, such as a diode, according to certain embodiments. Unless otherwise specified, when mentioned hereafter in this description, the term "charge storage component" may refer to any device that can enable charge storage, such as a capacitor, according to some embodiments. Unless otherwise specified, when mentioned hereafter in this description, the term "current storage component" may refer to any device that can store current, such as an inductor, according to certain embodiments. Unless otherwise specified, when mentioned hereafter in this description, the term "forward direction" may refer to the direction in which the energy flows from the battery to the energy storage circuit, and the term "reverse direction" may refer to the direction in which the energy flows from the energy storage circuit to the battery, according to some embodiments. Unless otherwise specified, when mentioned hereafter in this description, the term "battery" may comprise primary battery (e.g., dry battery or alkaline battery, etc.) and secondary battery (e.g., lithium-ion battery, nickel-cadmium battery, nickel-hydrogen battery, or lead-acid battery, etc.), according to certain embodiments. Unless otherwise specified, when mentioned hereafter in this description, the term "damping component" may refer to any device that inhibits current flow and thereby enables energy consumption, such as a resistor, etc., according to some embodiments. Unless otherwise specified, when mentioned hereafter in this description, the term "main loop" may refer to a loop composed of battery, damping component, switch unit and energy storage circuit connected in series according to certain embodiments.

It should be noted specially that, considering different types of batteries have different characteristics, in some embodiments of the present invention, "battery" may refer to an ideal battery that does not have internal parasitic resistance and parasitic inductance or has very low internal parasitic resistance and parasitic inductance, or may refer to a battery pack that has internal parasitic resistance and parasitic inductance; therefore, those skilled in the art should appreciate that if the battery is an ideal battery that does not have internal parasitic resistance and parasitic inductance or has very low internal parasitic resistance and parasitic inductance, the damping component R1 may refer to a damping component external to the battery and the current storage component L1 may refer to a current storage component external to the battery; if the battery is a battery pack that has internal parasitic resistance and parasitic inductance, the damping component R1 may refer to a damping component external to the battery or refer to the parasitic resistance in the battery pack, and the current storage component L1 may refer to a current storage component external to the battery or refer to the parasitic inductance in the battery pack, according to certain embodiments.

To ensure the normal service life of the battery, according to some embodiments, the battery can be heated under low temperature condition, which is to say, when the heating condition is met, the heating circuit is controlled to start heating for the battery; when the heating stop condition is met, the heating circuit is controlled to stop heating, according to certain embodiments.

In the actual application of battery, the battery heating condition and heating stop condition can be set according to the actual ambient conditions, to ensure normal charge/discharge performance of the battery, according to some embodiments.

Figure 1:
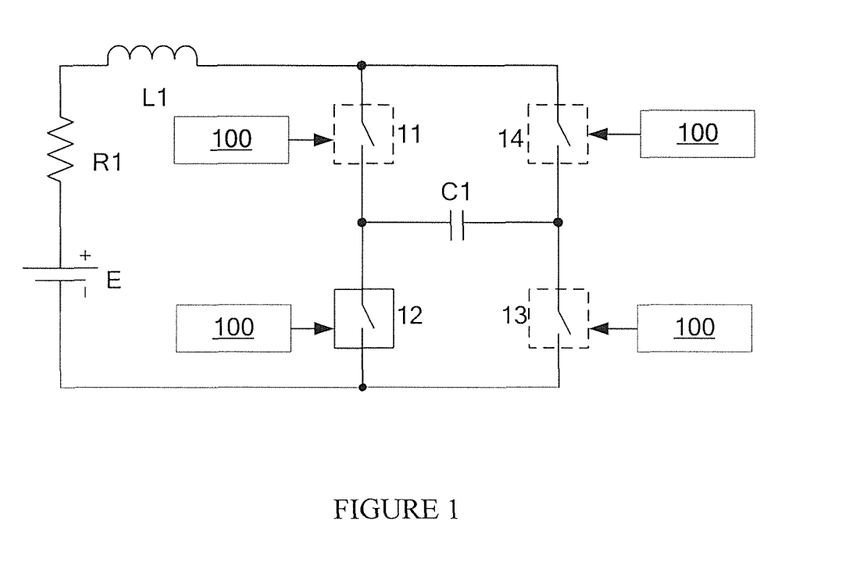
FIG. 1 is a schematic diagram of the battery heating circuit provided in one embodiment of the present invention.

To heat up a battery E in low temperature environment, one embodiment of the present invention provides a heating circuit for battery E; as shown in FIG. 1, the battery heating circuit comprising a first switch unit 11, a second switch unit 12, a third switch unit 13, a fourth switch unit 14, a switching control module 100, a damping component R1, a current storage component L1, and a charge storage component C1; the damping component R1 and current storage component L1 are configured to connect with the battery in series to form a branch; the first switch unit 11 and second switch unit 12 are connected in series with each other and then connected in parallel with the branch; the third switch unit 13 and fourth switch unit 14 are connected in series with each other and then connected in parallel with the branch; the charge storage component C1 is connected in series between the junction point of the first switch unit 11 and second switch unit 11 and the junction point of the third switch unit 13 and fourth switch unit 14, so that the first switch unit 11, charge storage component C1, and third switch unit 13 form a first branch configured to transfer energy from the battery to the charge storage component C1 and a second branch configured to transfer energy from the charge storage component C1 to the battery, and the fourth switch unit 14, charge storage component C1, and second switch unit 12 form a third branch configured to transfer energy from the battery to the charge storage component C1 and a fourth branch configured to transfer energy from the charge storage component C1 to the battery; the switching control module 100 is connected with the first switch unit 11, second switch unit 12, third switch unit 13, and fourth switch unit 14 respectively, and is configured to control ON/OFF of the first switch unit 11, second switch unit 12, third switch unit 13, and fourth switch unit 14, so as to control the energy flow between the battery and the charge storage component C1.

In the technical scheme of certain embodiments of the present invention, when the heating condition is met, the switching control module 100 controls the first switch unit 11 and third switch unit 13 to switch on, and thus the battery E and the charge storage component C1 are connected in series via the first switch unit 11 and third switch unit 13 to form a loop, and the battery E can discharge through the said loop, i.e., charge the charge storage component C1; when the current flow through the charge storage component C1 in the loop reaches zero after the peak current, the charge storage component C1 begins to discharge through the loop, i.e., charge the battery E; in the charge/discharge process of the battery E, the current in the loop can flow through the damping component R1 in forward direction and reverse direction, and thus the damping component R1 generates heat, so that the purpose of heating up the battery E is attained.

The switching control module 100 can be used to control the first switch unit 11 and third switch unit 13 to switch off when or after the current flow through the charge storage component C1 reaches zero after a current flow cycle, after the first switch unit 11 and the third switch unit 13 switch on.

Preferably, the switching control module 100 is configured to control the first switch unit 11 and third switch unit 13 to switch off when the current flow through the charge storage component C1 reaches zero after a current flow cycle after the first switch unit 11 and third switch unit 13 switch on; by switching off the first switch unit 11 and third switch unit 13 at that time when the current reaches zero, the disturbance to the entire circuit can be minimized.

In order to improve the heating efficiency of the heating circuit, in the technical scheme of certain embodiments of the present invention, the switching control module 100 can control the second switch unit 12 and fourth switch unit 14 to switch on after the first switch unit 11 and third switch unit 13 switch off; thus, the battery E and charge storage component C1 are connected in series via the second switch unit 12 and fourth switch unit 14 and form another loop, and the battery E can discharge through the said another loop, i.e., charge the charge storage component C1 in the direction reverse to the previous direction; when the current flow through the charge storage component C1 in the said another loop reaches zero after the peak current, the charge storage component C1 begins to discharge through the said another loop, i.e., charges the battery E; in the charge/discharge process of the battery E, the current in the said another loop flows through the damping component R1 in forward direction and reverse direction, and thus the damping component R1 generates heat, so that the purpose of heating up the battery E is attained.

The switching control module 100 can be used to control the second switch unit 12 and fourth switch unit 14 to switch off when or after the current flow through the charge storage component C1 reaches zero after the second switch unit 12 and fourth switch unit 14 switch on. Preferably, the switching control module 100 is configured to control the second switch unit 12 and fourth switch unit 14 to switch off when the current flow through the charge storage component C1 reaches zero after a current flow cycle after the second switch unit 12 and fourth switch unit 14 switch on; by switching off the second switch unit 12 and fourth switch unit 14 at that time when the current reaches zero, the disturbance to the entire circuit can be minimized.

By inverting the voltage polarity of the charge storage component C1, the heating circuit for battery E provided in certain embodiments of the present invention achieves heating of the battery E in the charge/discharge cycles; higher heating efficiency, simple structure, and small system footprint could be achieved.

Thus, when the battery need to be heated, the switching control module 100 controls the first switch unit 11, second switch unit 12, third switch unit 13, and fourth switch unit 14 to switch on or off, so as to control the energy flowing between the battery E and the charge storage component C1, to attain the purpose of heating up the battery E; when heating is not needed any more, the switching control module 100 controls the switch unit 11, second switch unit 12, third switch unit 13, and fourth switch unit 14 to switch off, so as to stop the heating of the battery E. The switching control module 100 controls the first switch unit 11 and third switch unit 13, as well as the second switch unit 12 and fourth switch unit 14 to switch on and off in alternate at an appropriate time interval, which can be set as needed according to the actual demand for operation. For example, the switching control module 100 can control the first switch unit 11 and third switch unit 13 to switch off for a first preset time interval, then control the second switch unit 12 and fourth switch unit 14 to switch on; or, the switching control module 100 can control the second switch unit 12 and fourth switch unit 14 to switch off for a second preset time interval, then control the first switch unit 11 and third switch unit 13 to switch on; the first preset time interval and the second preset time interval can be zero (i.e., when a group of switch units are controlled to switch off, the other group of switch units are controlled to switch on at the same time), and can be equal to each other or not equal to each other. Certain embodiments of the present invention do not impose any limitation to those time intervals.

To keep the energy flowing back-and-forth between the battery E and the charge storage component C1, the first switch unit 11, charge storage component C1, and third switch unit 13 form a first branch configured to transfer energy from the battery E to the charge storage component C1 and a second branch configured to transfer energy from the charge storage component C1 to the battery E; the fourth switch unit 14, charge storage component C1, and second switch unit 12 form a third branch configured to transfer energy from the battery E to the charge storage component C1 and a fourth branch configured to transfer energy from the charge storage component C1 to the battery E; the switching control module 100 is configured to control ON/OFF of the first branch and second branch by controlling ON/OFF of the first switch unit 11 and third switch unit 13, and control ON/OFF of the third branch and fourth branch by controlling ON/OFF of the second switch unit 12 and fourth switch unit 14.

In one embodiment of the present invention, the first switch unit 11, second switch unit 12, third switch unit 13, and fourth switch unit 14 are two-way switches. Thus, the energy can be controlled to flow between the battery E and the charge storage component C1 by controlling ON/OFF of the first switch unit 11, second switch unit 12, third switch unit 13, and fourth switch unit 14.

If the first switch unit 11, second switch unit 12, third switch unit 13, and fourth switch unit 14 are composed only by two-way switches, the circuit is simple, and the system has smaller footprint and is easy to implement; however, to achieve energy flow cut-off in forward direction and reverse direction, the following embodiment of first switch unit 11, a second switch unit 12, a third switch unit 13, and a fourth switch unit 14 is provided further in the present invention.

Preferably, at least one of the first switch unit 11, second switch unit 12, third switch unit 13, and fourth switch unit 14 is composed of two one-way switches connected in parallel opposite to each other. Thus, energy flow cut-off in forward direction and reverse direction can be achieved by controlling the two one-way switches connected in parallel opposite to each other with the switching control module 100. Those skilled in the art should understand that the one-way switches can be implemented in a variety of ways. Certain embodiments of the present invention do not impose any limitation to the specific implementation of the one-way switches; for example, the one-way switches can be implemented directly with one-way switches, or can be implemented with switches and one-way semiconductor components connected in series to each other, respectively. Hereafter one embodiment in which the one-way switches are composed of switches and one-way semiconductor components connected in series respectively will be detailed.

Figure 2:
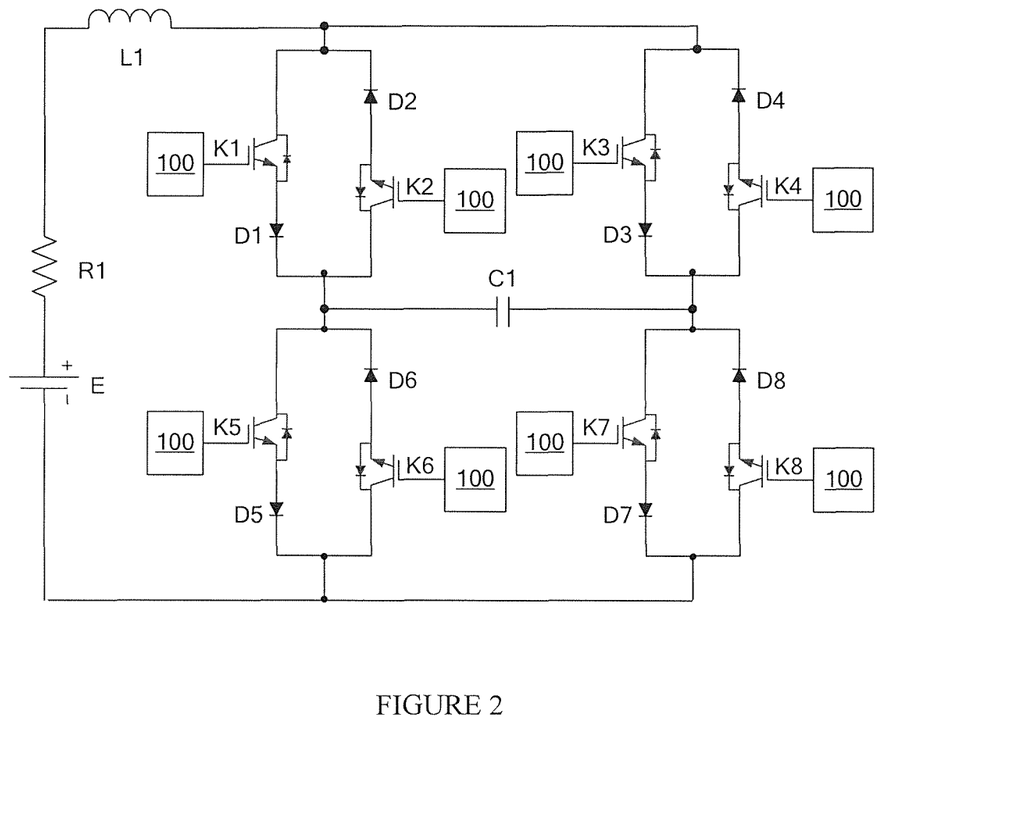
FIG. 2 is a schematic diagram of one embodiment of the battery heating circuit provided in the present invention.

In one embodiment, as shown in FIG. 2, the first switch unit 11 comprises a switch K1, a switch K2, a one-way semiconductor component D1, and a one-way semiconductor component D2; the third switch unit 13 comprises a switch K7, a switch K8, a one-way semiconductor component D7, and a one-way semiconductor component D8; the switch K1, one-way semiconductor component D1, charge storage component C1, switch K7, and one-way semiconductor component D7 are connected in series to form the first branch; the switch K2, one-way semiconductor component D2, charge storage component C1, switch K8, and one-way semiconductor component D8 are connected in series to form the second branch; the switching control module 100 is connected with the switch K1, switch K2, switch K7, and switch K8, and is configured to control ON/OFF of the first branch and second branch by controlling ON/OFF of the switch K1, switch K2, switch K7, and switch K8.

The fourth switch unit 14 comprises a switch K3, a switch K4, a one-way semiconductor component D3, and a one-way semiconductor component D4; the second switch unit 12 comprises a switch K5, a switch K6, a one-way semiconductor component D5, and a one-way semiconductor component D6; the switch K3, one-way semiconductor component D3, charge storage component C1, switch K5, and one-way semiconductor component D5 are connected in series to form the third branch; the switch K4, one-way semiconductor component D4, charge storage component C1, switch K6, and one-way semiconductor component D6 are connected in series to form the fourth branch; the switching control module 100 is connected with the switch K3, switch K4, switch K5, and switch K6, and is configured to control ON/OFF of the third branch and fourth branch by controlling ON/OFF of the switch K3, switch K4, switch K5, and switch K6.

In another embodiment, at least one of the first switch unit 11, second switch unit 12, third switch unit 13, and fourth switch unit 14 is composed of two two-way switches connected in series opposite to each other. Thus, energy flow cut-off in forward direction and reverse direction can be achieved by controlling the two two-way switches connected in series opposite to each other with the switching control module 100. Hereafter the embodiment will be detailed.

Figure 3:
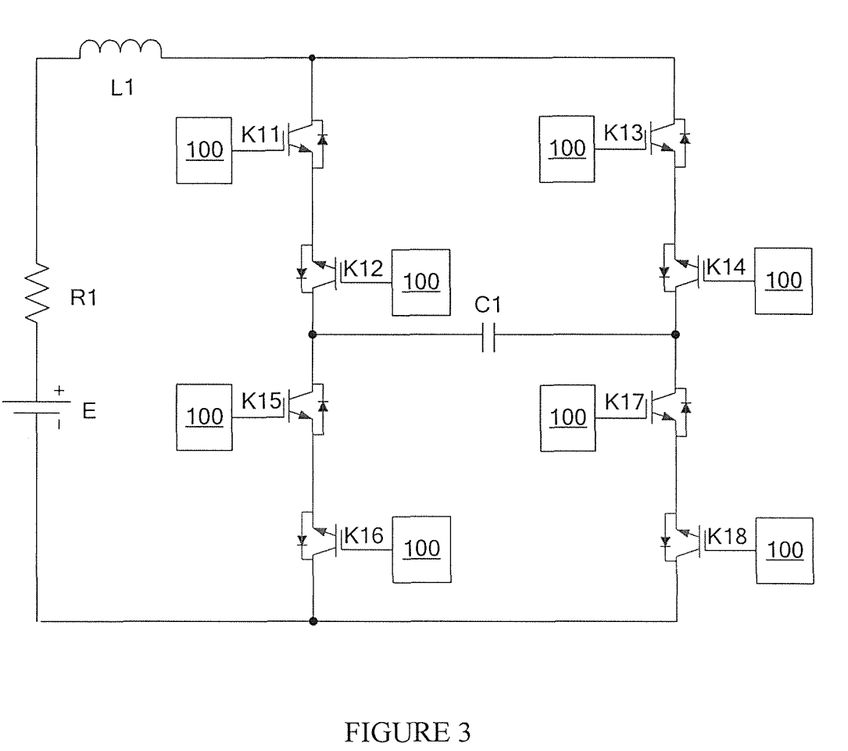
FIG. 3 is a schematic diagram of another embodiment of the battery heating circuit provided in the present invention.

As shown in FIG. 3, the first switch unit 11 comprises a two-way switch K11 and a two-way switch K12 connected in series opposite to each other; the third switch unit 13 comprises a two-way switch K17 and a two-way switch K18 connected in series opposite to each other; the two-way switch K11, two-way switch K12, charge storage component C1, two-way switch K17, and two-way switch K18 are connected in series to form the first branch and the second branch; the switching control module 100 is connected with the two-way switch K11, two-way switch K12, two-way switch K17, and two-way switch K18, and is configured to control ON/OFF of the first branch and the second branch by controlling ON/OFF of the two-way switch K11, two-way switch K12, two-way switch K17, and two-way switch K18.

The second switch unit 12 comprises a two-way switch K15 and a two-way switch K16 connected in series opposite to each other; the fourth switch unit 14 comprises a two-way switch K13 and two-way switch K14 connected in series opposite to each other; the two-way switch K13, two-way switch K14, charge storage component C1, two-way switch K15, and two-way switch K16 are connected in series to form the third branch and the fourth branch; the switching control module 100 is connected with the two-way switch K15, two-way switch K16, two-way switch K13, and two-way switch K14, and is configured to control ON/OFF of the third branch and the fourth branch by controlling ON/OFF of the two-way switch K15, two-way switch K16, two-way switch K13, and two-way switch K14.

The embodiment of first switch unit 11, second switch unit 12, third switch unit 13, and fourth switch unit 14 described here before enables the control of ON/OFF of the first branch, second branch, third branch, and fourth branch, respectively, so as to achieve energy flow cut-off in forward direction and reverse direction flexibly.

Preferably, the heating circuit further comprises a resistor connected in series with the first branch and/or the second branch, and/or a resistor connected in series with the third branch and/or the fourth branch (not shown). By connecting a resistor in series in the heating loop for battery E, the current flowing through the heating circuit can be decreased, and thereby the battery E can be protected against damages resulted from over-current in the loop.

The switching control module 100 can be a separate controller, which, by using internal program setting, achieves ON/OFF control of different external switches; or, the switching control module 100 may comprise a plurality of controllers, for example, a switching control module 100 can be set for each of the first switch unit 11, the second switch unit 12, the third switch unit 13, and the fourth switch unit 14; or, the plurality of switching control modules 100 can be integrated into an assembly. Certain embodiments of the present invention do not impose any limitation to the form of implementation of the switching control module 100.

Hereafter the working principle of the embodiments of the heating circuit for battery E will be described briefly with reference to FIG. 2-4. It should be noted that though the features and components of certain embodiments of the present invention are described specifically with reference to FIG. 2-4, each feature or component can be used separately without other features and components, or can be used in combination or not in combination with other features and components. The embodiments of the heating circuit for battery E provided in the present invention are not limited to those shown in FIGS. 2-4.

Figure 4:
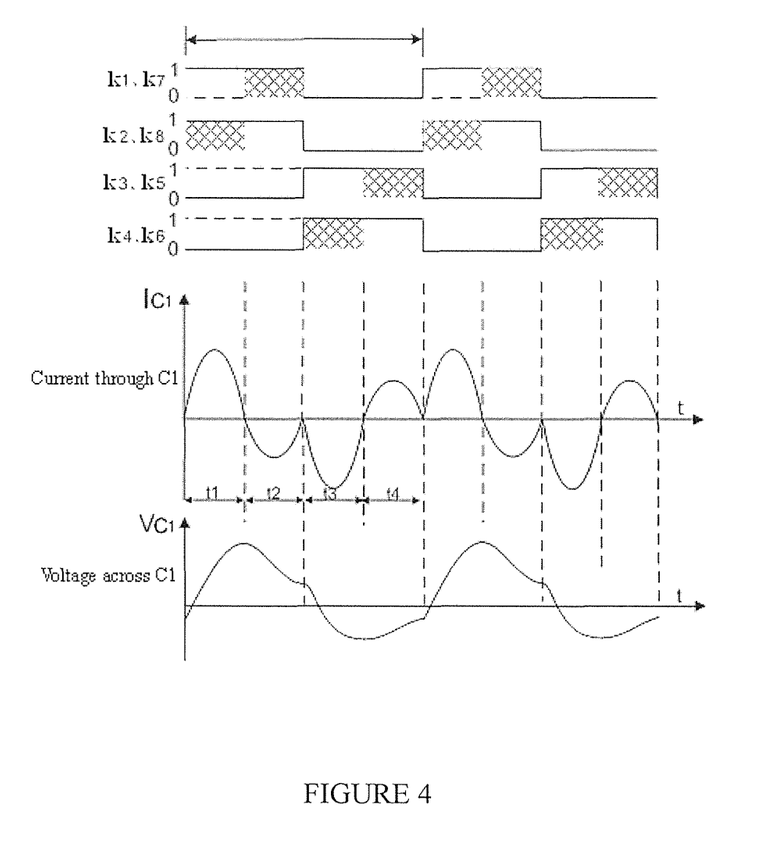
FIG. 4 is a timing sequence diagram of the waveform corresponding to the heating circuit shown in FIG. 2.

In the heating circuit for battery E shown in FIG. 2, the switch K1, switch K2, one-way semiconductor component D1, and one-way semiconductor component D2 form the first switch unit 11; the switch K5, switch K6, one-way semiconductor component D5, and one-way semiconductor component D6 form the second switch unit 12; the switch K7, switch K8, one-way semiconductor component D7, and one-way semiconductor component D8 form the third switch unit 13; the switch K3, switch K4, one-way semiconductor component D3, and one-way semiconductor component D4 form the fourth switch unit 14; the damping component R1 and current storage component L1 are connected with the battery E in series to form a branch; the switching control module 100 can control ON/OFF of the switches K1-K8. FIG. 4 is a timing sequence diagram of the waveform corresponding to the heating circuit shown in FIG. 2, wherein: $V_{C1}$ refers to the voltage value across the charge storage component C1, and $I_{C1}$ refers to the value of current through the charge storage component C1. The working process of the heating circuit shown in FIG. 2 is as follows:

a) When the battery E need to be heated, the switching control module 100 controls the switches K1 and K7 to switch on, and thus the battery E discharges through the loop composed of switch K1, one-way semiconductor component D1, charge storage component C1, switch K7, and one-way semiconductor component D7, as indicated by the time duration $t_1$ in FIG. 4;

b) The switching control module 100 controls the switches K1 and K7 to switch off and controls the switches K2 and K8 to switch on at the same time when the current flowing through the charge storage component C1 reaches zero after the peak current; thus, the battery E is charged through the loop composed of charge storage component C1, switch K2, one-way semiconductor component D2, switch K8, and one-way semiconductor component D8, as indicated by the time duration $t_2$ in FIG. 4;

c) The switching control module 100 controls the switches K2 and K8 to switch off and controls the switches K3 and K5 to switch on at the same time when the current flow through the charge storage component C1 reaches zero after the peak current; thus, the battery E discharges through the loop composed of the switch K3, one-way semiconductor component D3, charge storage component C1, switch K5, and one-way semiconductor component D5, as indicated by the time duration $t_3$ in FIG. 4;

d) The switching control module 100 controls the switches K3 and K5 to switch off and controls the switches K4 and K6 to switch on at the same time when the current flow through the charge storage component C1 reaches zero after the peak current; thus, the battery E is charged through the loop composed of the charge storage component C1, switch K4, one-way semiconductor component D4, switch K6, and one-way semiconductor component D6, as indicated by the time duration t4 in FIG. 4; the switching control module 100 controls the switches K4 and K6 to switch off when the current flow through the charge storage component C1 reaches zero after the peak current;

e) The steps a) to d) are repeated; thus, the battery E is heated up continuously in the charge/discharge cycles, till the battery E meets the heating stop condition.

Figure 5:
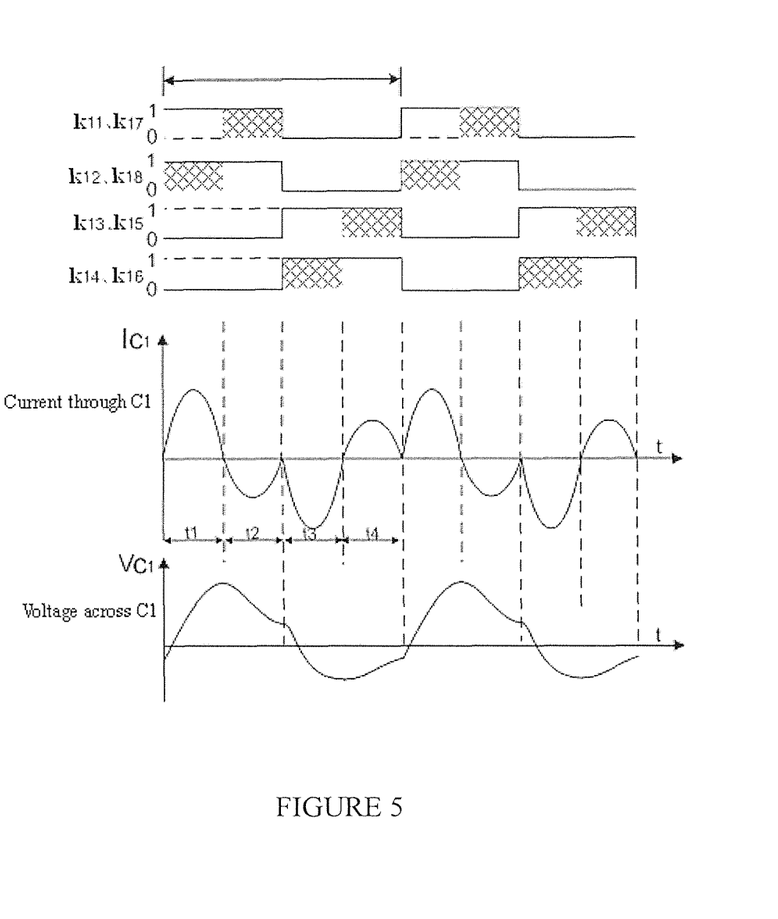
FIG. 5 is a timing sequence diagram of the waveform corresponding to the heating circuit shown in FIG. 3.

In the heating circuit for battery E shown in FIG. 3, the switches K11 and K12 constitute the first switch unit 11, the switches K15 and K16 constitute the second switch unit 12, the switches K17 and K18 constitute the third switch unit 13, and the switches K13 and K14 constitute the fourth switch unit 14; the damping component R1 and current storage component L1 are connected with the battery E in series to form a branch; the switching control module 100 can control ON/OFF of the switches K11, K12, K13, K14, K15, K16, K17, and K18. FIG. 5 is a timing sequence diagram of the waveform corresponding to the heating circuit shown in FIG. 3, wherein: $V_{C1}$ refers to the voltage value across the charge storage component C1, and $I_{C1}$ refers to the value of current through the charge storage component C1. The working process of the heating circuit shown in FIG. 5 is as follows:

a) When the battery E need to be heated, the switching control module 100 controls the switches K11 and K17 to switch on, and thus the battery E discharges through the loop composed of switch K11, one-way semiconductor component D2, charge storage component C1, switch K17, and one-way semiconductor component D8, as indicated by the time duration $t_1$ in FIG. 5;

b) The switching control module 100 controls the switches K17 and K17 to switch off and controls the switches K12 and K18 to switch on at the same time when the current flow through the charge storage component C1 reaches zero after the peak current; thus, the battery E is charged through the loop composed of the charge storage component C1, switch K12, one-way semiconductor component D1, switch K18, and one-way semiconductor component D7, as indicated by the time duration $t_2$ in FIG. 5;

c) The switching control module 100 controls the switches K12 and K18 to switch off and controls the switches K13 and K15 to switch on at the same time when the current flow through the charge storage component C1 reaches zero after the peak current; thus, the battery E discharges through the loop composed of the switch K13, one-way semiconductor component D4, charge storage component C1, switch K15, and one-way semiconductor component D6, as indicated by the time duration $t_3$ in FIG. 5;

d) The switching control module 100 controls the switches K13 and K15 to switch off and controls the switches K14 and K16 to switch on at the same time when the current flow through the charge storage component C1 reaches zero after the peak current; thus, the battery E is charged through the loop composed of the charge storage component C1, switch K4, one-way semiconductor component D3, switch K6, and one-way semiconductor component D5; the switching control module 100 controls the switches K14 and K16 to switch off when the current flow through the charge storage component C1 reaches zero after the peak current;

e) The steps a) to d) are repeated; thus, the battery E is heated up continuously in the charge/discharge cycles, till the battery E meets the heating stop condition.

The heating circuit provided in certain embodiments of the present invention can improve the charge/discharge performance of the battery E; in addition, safety problem caused by short circuit can be avoided when the battery E is heated due to the existence of the charge storage component C1 connected in series, and therefore the battery E can be protected effectively.

For example, some or all components of various embodiments of the present invention each are, individually and/or in combination with at least another component, implemented using one or more software components, one or more hardware components, and/or one or more combinations of software and hardware components. In another example, some or all components of various embodiments of the present invention each are, individually and/or in combination with at least another component, implemented in one or more circuits, such as one or more analog circuits and/or one or more digital circuits.

While some embodiments of the present invention are described above with reference to the accompanying drawings, the present invention is not limited to the details of those embodiments. Those skilled in the art can make modifications and variations, without departing from the spirit of the present invention. However, all these modifications and variations shall be deemed as falling into the scope of the present invention.

In addition, it should be noted that the specific technical features described in the above embodiments can be combined in any appropriate way, provided that there is no conflict. To avoid unnecessary repetition, certain possible combinations are not described specifically. Moreover, the different embodiments of the present invention can be combined as needed, as long as the combinations do not deviate from the spirit of the present invention. However, such combinations shall also be deemed as falling into the scope of the present invention.

Hence, although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A heating circuit for a battery, comprising:
a first switch unit, a second switch unit, a third switch unit, a fourth switch unit, a switching control module, a damping component, a current storage component, and a charge storage component; wherein:
the damping component and current storage component are connected with the battery to form at least a first part of a first loop;
the first switch unit and second switch unit are connected with each other and with the first part of the first loop to form at least a second part of the first loop;

the third switch unit and fourth switch unit are connected with each other and with the first part of the first loop to form at least a part of a second loop;

the charge storage component is connected across a first junction point of the first loop between the first switch unit and second switch unit and a second junction point of the second loop between the third switch unit and fourth switch unit, so that the first switch unit, charge storage component, and third switch unit form a first branch configured to transfer energy from the battery to the charge storage component and a second branch configured to transfer energy from the charge storage component to the battery, and the fourth switch unit, charge storage component, and second switch unit form a third branch configured to transfer energy from the battery to the charge storage component and a fourth branch configured to transfer energy from the charge storage component to the battery; and the switching control module is connected with the first switch unit, the second switch unit, the third switch unit, and the fourth switch unit respectively, and is configured to control switching on and off of the first switch unit, the second switch unit, the third switch unit, and the fourth switch unit, so as to control the energy flow between the battery and the charge storage component.

2. The heating circuit according to claim 1, wherein: the damping component is a parasitic resistance within the battery, and the current storage component is a parasitic inductance within the battery.

3. The heating circuit according to claim 1, wherein: the damping component is a resistor external to the battery, the current storage component is an inductor, and the charge storage component is a capacitor external to the battery.

4. The heating circuit according to claim 1, wherein: the first switch unit, the second switch unit, the third switch unit, and the fourth switch unit are two-way switches.

5. The heating circuit according to claim 1, wherein: at least one of the first switch unit, the second switch unit, the third switch unit, and the fourth switch unit is composed of two one-way switches connected in parallel opposite to each other.

6. The heating circuit according to claim 1, wherein: at least one of the first switch unit, the second switch unit, the third switch unit, and the fourth switch unit is composed of two two-way switches connected in series opposite to each other.

7. The heating circuit according to claim 1, wherein: the heating circuit further comprises a resistor connected in series with the first branch and/or the second branch, and/or a resistor connected in series with the third branch and/or the fourth branch.

8. The heating circuit according to claim 1, wherein: the switching control module is configured to control the first switch unit and third switch unit to switch off when or after the current flow through the charge storage component reaches zero after a current flow cycle, after the first switch unit and third switch unit switch on, and is also configured to control the second switch unit and fourth switch unit to switch off when or after the current flow through the charge storage component reaches zero after a current flow cycle, after the second switch unit and the fourth switch unit switch on.

* * * * *